(12) United States Patent
New et al.

(10) Patent No.: US 7,098,710 B1
(45) Date of Patent: Aug. 29, 2006

(54) MULTI-SPEED DELAY-LOCKED LOOP

(75) Inventors: Bernard J. New, Carmel Valley, CA (US); Andrew K. Percey, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/719,743

(22) Filed: Nov. 21, 2003

(51) Int. Cl.
*H03L 7/06* (2006.01)

(52) U.S. Cl. .................. 327/158; 327/161; 327/261

(58) Field of Classification Search ........ 327/147–150, 327/152, 159, 161, 237, 242–245, 261, 262, 327/269, 270, 276, 284, 294, 295, 158
See application file for complete search history.

(56) References Cited

U.S. PATENT DOCUMENTS

| | | | | |
|---|---|---|---|---|
| 5,463,337 A | * | 10/1995 | Leonowich | 327/158 |
| 5,686,867 A | * | 11/1997 | Sutardja et al. | 331/57 |
| 5,811,985 A | * | 9/1998 | Trimberger et al. | 326/38 |
| 5,896,068 A | * | 4/1999 | Moyal | 331/34 |
| 5,999,027 A | * | 12/1999 | Yamazaki | 327/161 |
| 6,005,448 A | * | 12/1999 | Pickering et al. | 331/57 |
| 6,252,443 B1 | * | 6/2001 | Dortu et al. | 327/156 |
| 6,271,713 B1 | * | 8/2001 | Krishnamurthy | 327/534 |
| 6,275,079 B1 | * | 8/2001 | Park | 327/143 |
| 6,330,296 B1 | * | 12/2001 | Atallah et al. | 375/376 |
| 6,462,623 B1 | * | 10/2002 | Horan et al. | 331/17 |
| 6,504,441 B1 | * | 1/2003 | Eker | 331/136 |
| 6,777,990 B1 | * | 8/2004 | Partsch et al. | 327/149 |
| 6,788,119 B1 | * | 9/2004 | Hyland et al. | 327/158 |

OTHER PUBLICATIONS

Xilinx, Inc., "Using Delay-Locked Loops in Spartan-II FPGAs," Application Note: Spartan-II FPGAs, XAPP174, v1.1, Jan. 24, 2000, pp. 1-13, Xilinx, Inc., 2100 Logic Drive, San Jose, CA 95124.

* cited by examiner

*Primary Examiner*—Timothy P. Callahan
*Assistant Examiner*—Hai L. Nguyen
(74) *Attorney, Agent, or Firm*—E. Eric Hoffman; LeRoy D. Maunu; Justin Liu

(57) ABSTRACT

A delay locked loop includes a primary delay line having a plurality of series-connected delay elements, wherein each of the delay elements operates in response to a supply voltage provided on a voltage supply line. When the delay locked loop is configured to operate in response to an input clock signal having a relatively high frequency, the voltage supply line is coupled to receive a first supply voltage. When the delay locked loop is configured to operate in response to an input clock signal having a relatively low frequency, the voltage supply line is coupled to receive a second supply voltage, which is significantly lower than the first supply voltage. When operating in response to the first supply voltage, the delay elements exhibit relatively short delays. Conversely, when operating in response to the second supply voltage, the delay elements exhibit relatively long delays.

23 Claims, 4 Drawing Sheets

MULTI-SPEED DELAY-LOCKED LOOP

FIELD OF THE INVENTION

The present invention relates to a delay-locked loop circuit. More specifically, the present invention relates to a delay-locked loop circuit having an extended operating range provided by user configuration control over inverter delay.

PRIOR ART

FIG. 1 is a block diagram of a portion of an integrated circuit such as a conventional field programmable gate array (FPGA) 100, which includes delay lock loop (DLL) 101, global clock driver 102, global clock routing network 103, output flip-flop 104, and input flip-flop 105. Other well-known elements of FPGA 100 are not illustrated in FIG. 1 for purposes of clarity. An external reference clock signal CLK_IN is routed to DLL 101. In response to the CLK_IN signal, DLL 101 generates an output clock signal CLK_OUT, which is provided to global clock driver 102. The output clock signal CLK_OUT is transmitted through global clock driver 102 to global clock routing network 103. Global clock routing network 103 transmits the output clock signal CLK_OUT throughout FPGA 100 with minimum skew within the FPGA, but with a significant delay. A plurality of distributed clock signals, all exhibiting a similar delay, are provided at ends of global clock routing network 103. One of these distributed clock signals is illustrated as the distributed clock signal, DIST_CLK. The DIST_CLK signal is used to clock data values within FPGA 100. For example, the DIST_CLK signal is used to clock the data value $D_1$ into output flip-flop 104, thereby providing an output data value $D_{OUT}$, which is synchronous with the DIST_CLK signal. Similarly, the DIST_CLK signal is used to clock the data value $D_{IN}$ into input flip-flop 105, thereby providing an input data value $Q_1$, which is synchronous with the DIST_CLK signal.

The DIST_CLK signal is also provided to a feedback terminal of DLL 101. In response to the DIST_CLK signal, DLL 101 introduces a delay in the output clock signal CLK_OUT. DLL 101 controls the amount of delay introduced, such that the active edges of the distributed clock signal DIST_CLK has a predetermined phase relationship (i.e., a fixed, known offset) with respect to the active edges of the input clock signal CLK_IN.

For the above-described purpose, FPGA 100 uses DLL 101 to artificially increase the delay of the internally distributed clock signal DIST_CLK. The additional delay introduced by the DLL is feedback-controlled such that the total delay (i.e., the delay introduced by DLL 101 plus the clock distribution delay) yields a pre-determined desired setup and hold time relationship between clock and data. For example, the total delay may be equal to one clock period, such that the internally distributed clock signal DIST_CLK is synchronized with the external clock signal CLK_IN.

Typically, a series cascade of inverters within DLL 101 is used to provide the necessary delay. More specifically, DLL 101 provides the necessary delay by selecting the output of the appropriate inverter in the series cascade of inverters. As an optimization, the power supply to these inverters may be regulated such that the delay is independent of temperature, supply voltage, and process variations. One example of DLL 101 is described in more detail in Xilinx Application note XAPP174, "Using Delay-Locked Loops in Spartan-II FPGAs", Jan. 24, 2000.

FPGA 100 can be operated at different clock frequencies. In order to facilitate operation at lower clock frequencies (i.e., longer clock periods) DLL 101 must be able to introduce longer delays. DLL 101 must therefore include relatively long inverter chains in order to provide these longer delays. Consequently, low-frequency DLLs are expensive to implement because of the large number of inverters required. It would therefore be desirable to have a low-cost manner of implementing low-frequency DLLS.

SUMMARY

Accordingly, the present invention provides a mechanism for extending the operating range of a DLL by providing a user with configuration control over the delay elements (e.g., one or more inverters) of the DLL. For example, the configuration control can be used to double the delay of each inverter, thereby doubling the maximum delay achievable. As a result, the DLL of the present invention allows an associated FPGA to operate at half the frequency of an FPGA having a DLL of the prior art.

In one embodiment, the inverter delay is increased by reducing the power supply voltage to the inverters. Alternately, the inverter delay can be increased by controlling the body bias of the transistors used to create the inverters.

In an alternate embodiment, one or more fast inverters are retained to provide fine delay control. These fast inverters permit greater synchronization accuracy when the DLL is locked, and also reduce jitter. There are sufficiently few of these fast elements to guarantee monotonicity of the introduced delay. If the delay of the primary delay chain is increased dramatically, the delay of the fast inverters may also be increased in certain embodiments.

The present invention will be more fully understood in view of the following description and drawings.

DETAILED DESCRIPTION

Figure 2:
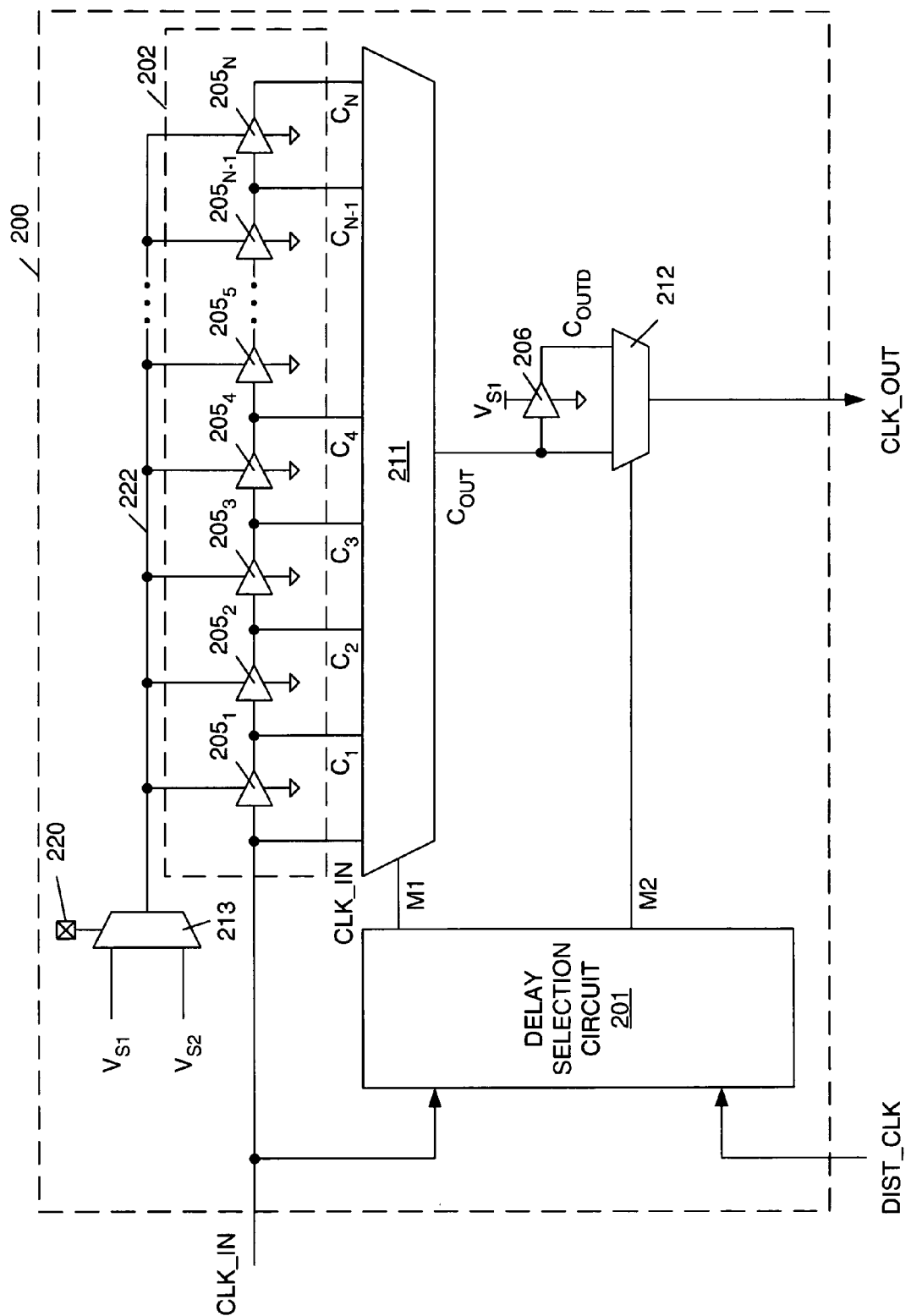
FIG. 2 is a block diagram of a delay locked loop (DLL) in accordance with one embodiment of the present invention.

FIG. 2 is a block diagram of a delay locked loop (DLL) 200 in accordance with one embodiment of the present invention. DLL 200 includes delay selection circuit 201, primary delay chain 202 (which includes delay elements $205_1$–$205_N$), fast delay element 206, multiplexers 211–213, configuration memory cell 220 and voltage supply, or distribution, line 222. In the described embodiment, each of delay elements $205_1$–$205_N$ (and fast delay element 206) includes an even number of series connected inverters. As a result, each of these delay elements provides an output signal that is delayed from the input signal and non-inverted.

Figure 1:
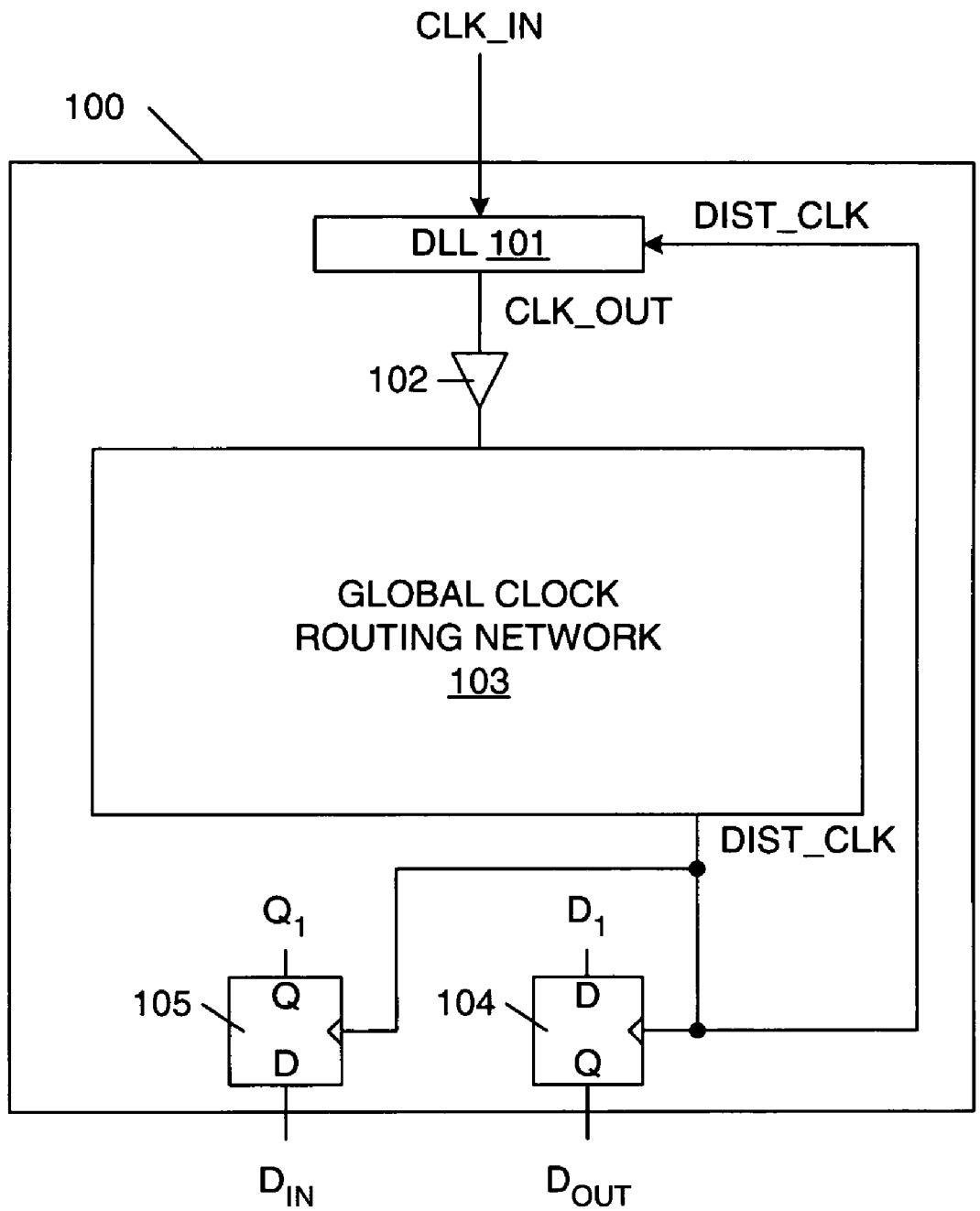
FIG. 1 is a block diagram of a conventional FPGA, including the global clock distribution network.

In accordance with the described embodiment, DLL 200 replaces DLL 101 in FPGA 100 (FIG. 1). Thus, DLL 200 receives the input clock signal CLK_IN received by the FPGA and the distributed clock signal DIST_CLK used to clock data out of the FPGA. In response, DLL 200 provides the output clock signal CLK_OUT to the global clock driver. DLL 200 introduces a delay to the input clock signal CLK_IN to create the output clock signal CLK_OUT. This delay is selected such that the distributed clock signal DIST_CLK has a predetermined, fixed offset with respect to the input clock signal CLK_IN. In the embodiments described below, the delay is selected such that the distributed clock signal DIST_CLK is synchronous with the input clock signal CLK_IN.

Within DLL 200, the input clock signal CLK_IN is provided to an input terminal of delay chain 202, an input terminal of multiplexer 211, and an input terminal of delay selection circuit 201. The distributed clock signal DIST_CLK is also applied to an input terminal of delay selection circuit 201. Delay selection circuit 201 provides multiplexer control signals M1 and M2 to multiplexers 211 and 212, respectively, in response to the CLK_IN and DIST_CLK signals. The multiplexer control signals M1 and M2 select the delay introduced to the CLK_IN signal in order to create the CLK_OUT signal. Multiplexer control signals M1 and M2 can be multi-wire signals in other embodiments.

The input clock signal CLK_IN propagates through the N series-connected delay elements $205_1$–$205_N$. Each of these delay elements $205_1$–$205_N$ provides a corresponding delayed clock signal $C_1$–$C_N$, respectively, to an associated input terminal of multiplexer 211. In the described embodiment, each of the delay elements $205_1$–$205_N$ introduces a signal delay, D. Thus, the delay introduced by delay element $205_K$ (where K is equal to an integer equal to 1 to N, inclusive) is equal to K*D. As described in more detail below, the signal delay D is selected to be relatively small ($d_1$) during high frequency operation, and relatively large ($d_2$) during low frequency operation.

Figure 3:
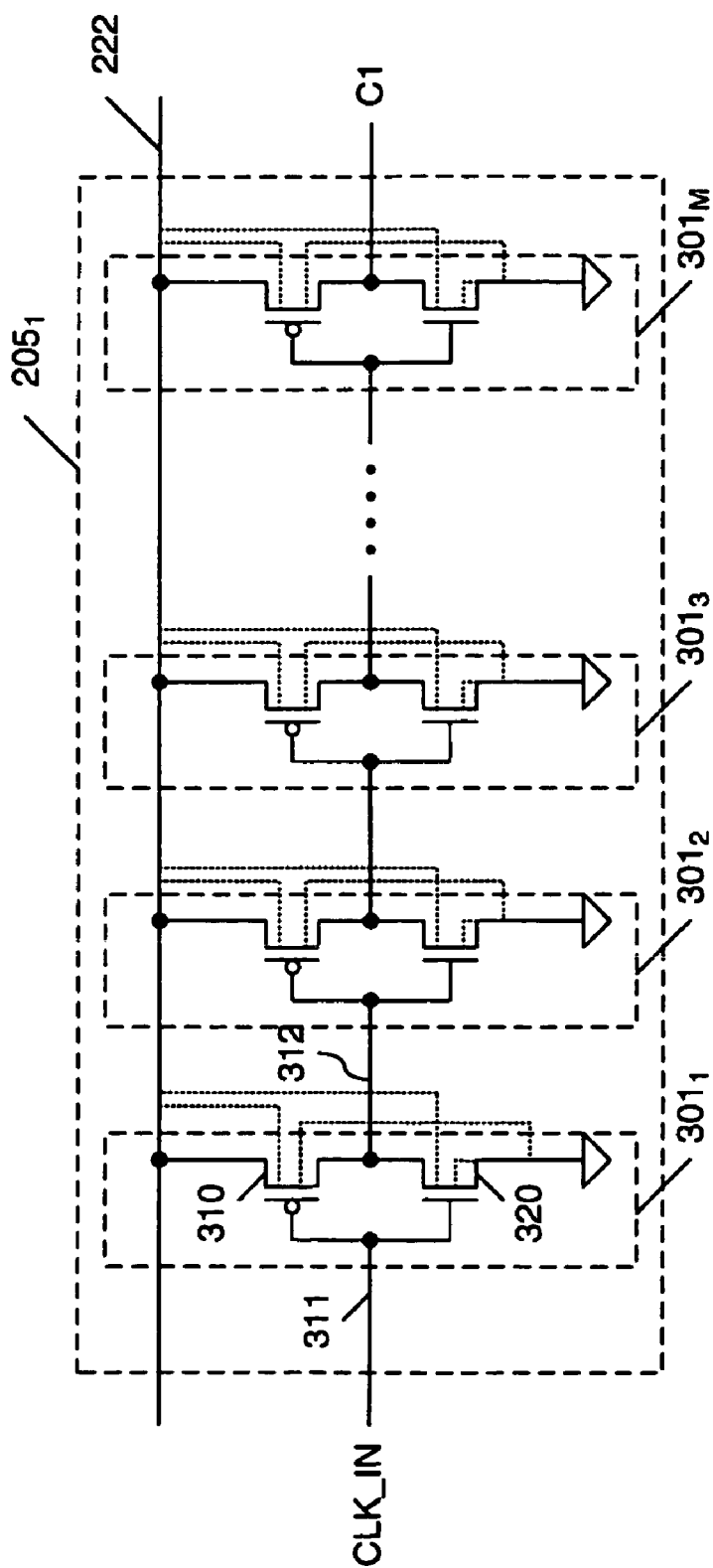
FIG. 3 is a circuit diagram of a delay element in accordance with one embodiment of the present invention.

FIG. 3 is a circuit diagram of delay element $205_1$ in accordance with one embodiment of the present invention. Delay element $205_1$ includes a plurality of series-connected inverters $301_1$–$301_M$, where M is an even integer. Each of inverters $301_1$–$301_M$ includes a p-channel field effect transistor (FET) (e.g., p-channel FET 310) having a source coupled to voltage supply line 222, and a drain coupled to an inverter output terminal (e.g., inverter output terminal 312). Similarly, each of inverters $301_1$–$301_M$ includes an n-channel FET (e.g., n-channel FET 320) having a source coupled to a ground voltage supply and a drain coupled to the inverter output terminal. The gates of the p-channel and n-channel FETs are commonly coupled to an inverter input terminal (e.g., inverter input terminal 311). Each of inverters $301_1$–$301_M$ introduce a delay to a received signal, such that the entire chain of inverters $301_1$–$301_M$ introduces the signal delay, D.

Returning now to FIG. 2, multiplexer 213 has input terminals coupled to receive supply voltages $V_{S1}$ and $V_{S2}$, an output terminal coupled to voltage supply line 222, and a control terminal coupled to configuration memory cell 220. Configuration memory cell 220 is programmed to store a configuration data value provided by a user during configuration of the associated FPGA. Configuration memory cell 220 is known to those of ordinary skill in the art of FPGA design. In an alternate embodiment, the control terminal of multiplexer 213 is coupled to an active signal, the value of which may be allowed to change during operation. Multiplexer 213 routes one of the supply voltages $V_{S1}$ or $V_{S2}$ to voltage supply line 222 in response to the configuration data value stored in configuration memory cell 220. In the described embodiment, supply voltage $V_{S1}$ is significantly greater than supply voltage $V_{S2}$. For instance, supply voltage $V_{S1}$ may be 10 or more percent greater than supply voltage $V_{S2}$. As described in more detail below, multiplexer 213 is controlled to provide the relatively high supply voltage $V_{S1}$ to voltage supply line 222 when FPGA is configured to operate at a relatively high frequency. Conversely, multiplexer 213 is controlled to provide the relatively low supply voltage $V_{S2}$ to voltage supply line 222 when FPGA is configured to operate at a relatively low frequency.

Multiplexer 211 routes the input clock signal CLK_IN or one of the delayed clock signals $C_1$–$C_N$ as the clock signal $C_{OUT}$ in response to the multiplexer control signal M1. The clock signal $C_{OUT}$ is provided to an input terminal of multiplexer 212, and to an input terminal of fast delay element 206. In the described embodiment, fast delay element 206 is substantially identical to delay elements $205_1$–$205_N$, except that fast delay element 206 is always coupled to receive the supply voltage $V_{S1}$, regardless of the state of configuration memory cell 220. Delay element 206 provides a delayed clock signal $C_{OUTD}$ to an input terminal of multiplexer 212. Multiplexer 212 routes one of the received clock signals $C_{OUT}$ or $C_{OUTD}$ as the output clock signal CLK_OUT in response to multiplexer control signal M2.

DLL 200 operates as follows in accordance with one embodiment of the present invention. As described above, supply voltage $V_{S1}$ is significantly greater than supply voltage $V_{S2}$. In one embodiment, supply voltage $V_{S1}$ is equal to a nominal positive supply voltage of the associated FPGA. For example, if the input/output circuitry (e.g., input/output blocks, or IOBs) of the associated FPGA operates in response to a nominal supply voltage of 1.2 Volts, then the supply voltage $V_{S1}$ can be set equal to 1.2 Volts. Each of the delay elements $205_1$–$205_N$ exhibits a relatively small signal delay, $d_1$, when operating in response to supply voltage $V_{S1}$.

Each of the delay elements $205_1$–$205_N$ exhibits a relatively large signal delay, $d_2$, when operating in response to the lower supply voltage $V_{S2}$. The supply voltage $V_{S2}$ may be selected such that the signal delay $d_2$ is more than 10 percent longer than the delay $d_1$. In one embodiment, the supply voltage $V_{S2}$ is selected such that the signal delay $d_2$ is approximately twice as long as the signal delay $d_1$. The supply voltage $V_{S2}$ is also selected such that delay elements $205_1$–$205_N$ are able to operate reliably in response to this supply voltage $V_{S2}$. In other embodiments, the supply voltage $V_{S2}$ can have other values, in accordance with the requirements set forth above. It is important to note that the inverters (e.g., inverters $301_1$–$301_M$ in delay elements $205_1$–$205_N$ will naturally introduce more signal delay as the voltage on supply line 222 decreases.

Because fast delay element 206 operates in response to supply voltage $V_{S1}$, this delay element will always introduce the smaller signal delay, $d_1$, to the clock signal $C_{OUT}$. As described in more detail below, this enables fine-tuning of the total signal delay when operating at relatively low frequencies. Note that in applications where fine tuning is not necessary, delay element 206 and corresponding multiplexer 212 may be optional and signal $C_{OUT}$ may be provided directly as the output clock signal CLK_OUT.

To operate DLL 200, the user first determines the frequency at which the FPGA will be operated. If the FPGA is to be operated at a relatively high frequency (e.g., 100 MHz or above), then the user programs configuration memory cell 220 such that multiplexer 213 routes the high supply voltage $V_{S1}$ to voltage supply line 222. As a result, each of delay elements $205_1$–$205_N$ introduces the relatively small signal delay $d_1$ to the input clock signal CLK_IN. These small delay increments $d_1$ are desirable to adjust the delay of the output clock signal CLK_OUT. Stated another way, a high frequency input clock signal CLK_IN has a relatively small period. Thus, small delay increments are desirable to adjust the delay of the input clock signal CLK_IN, in this instance.

If the FPGA is to be operated at a relatively low frequency (e.g., 100 MHz or below), then the user programs configuration memory cell 220 such that multiplexer 213 routes the low supply voltage $V_{S2}$ to voltage supply line 222. As a result, each of delay elements $205_1$–$205_N$ introduces the relatively large delay $d_2$ to the input clock signal CLK_IN. These large delay increments $d_2$ are desirable to adjust the delay of the output clock signal CLK_OUT. Stated another way, a low frequency input clock signal CLK_IN has a relatively large period. Thus, large delay increments are desirable (and sometimes necessary) to add the necessary delay to the input clock signal CLK_IN.

Delay element 206 is capable of fine-tuning the delay introduced by delay line 202, when operating in response to an input clock signal CLK_IN having a relatively low frequency. Thus, if the relatively large signal delays $d_2$ introduced by delay elements $205_1$–$205_N$ are too large to introduce the required delay, then multiplexer 212 can be controlled to route the $C_{OUTD}$ signal as the output clock signal CLK_OUT. As a result, fast delay element 206 is effectively introduced to the end of the selected elements of delay chain 202. Thus, the relatively short signal delay $d_1$ of delay element 206 is added to the relatively long delays $d_2$ of the selected delay elements $205_1$–$205_N$. The short delay $d_1$ of delay element 206 thereby increases the accuracy of DLL 200, when operating at relatively low frequencies.

Note that when DLL 200 is operating at a relatively high frequency, fast delay element 206 can also be selected to increase the total delay to $(N+1)*d_1$. In another embodiment, fast delay element 206 is designed to provide multiple delays less than $d_1$ in order to allow even finer resolution tuning.

Figure 4:
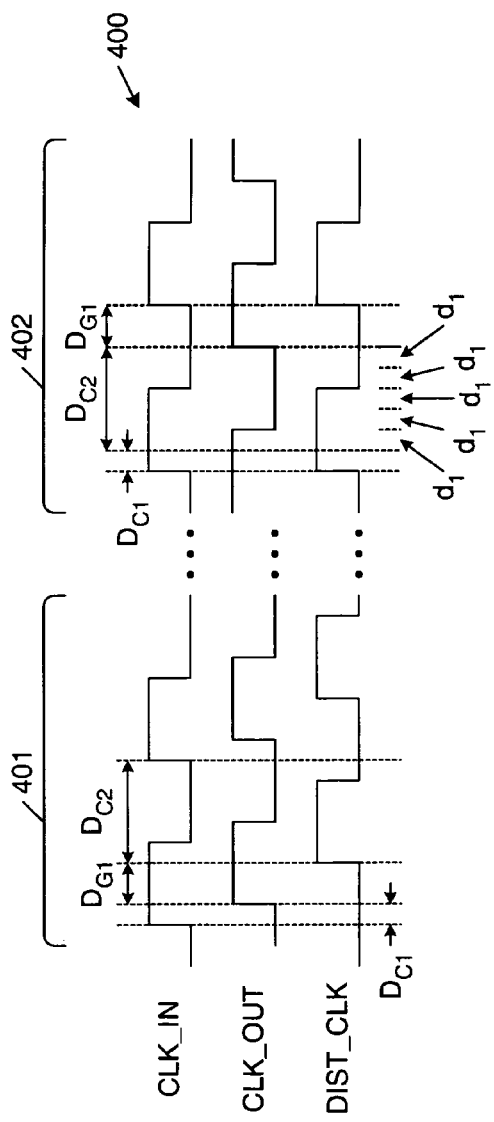
FIG. 4 is a waveform diagram illustrating the timing of various DLL clock signals during high frequency operation, in accordance with one embodiment of the present invention.

FIG. 4 is a waveform diagram 400 illustrating the timing of the clock signals CLK_IN, CLK_OUT and DIST_CLK during high frequency operation, in accordance with one embodiment of the present invention. Region 401 of waveform diagram 400 illustrates the CLK_IN, CLK_OUT and DIST_CLK signals before DLL 200 introduces any delay to the output clock signal CLK_OUT. At this time, the CLK_OUT signal exhibits a small delay $D_{C1}$ with respect to the input clock signal CLK_IN. The DIST_CLK signal exhibits a delay $D_{G1}$ with respect to the CLK_OUT signal. This delay $D_{G1}$ is introduced by the global clock routing network. In order for the rising edge of the distributed clock signal DIST_CLK to be synchronous with the rising edge of the input clock signal CLK_IN, a delay of $D_{C2}$ must be introduced to the distributed clock signal DIST_CLK.

Region 402 of waveform diagram 400 illustrates the CLK_IN, CLK_OUT and DIST_CLK signals after DLL 200 has introduced a delay of $D_{C2}$ to the output clock signal CLK_OUT. At this time, the CLK_IN and DIST_CLK signals are synchronous. In the illustrated example, the delay $D_{C2}$ is equal to $5*d_1$. Thus, DLL 200 introduces the delay $D_{C2}$ by generating multiplexer control signals M1 and M2 that cause the clock signal ($C_5$) of the fifth delay element ($205_5$) in delay chain 202 to be routed as the output clock signal CLK_OUT. In accordance with the described embodiment, delay elements $205_1$–$205_5$ of delay chain 202 are sequentially enabled until the proper delay is achieved. In other embodiments, DLL 200 can be controlled to introduce a delay that results in the DIST_CLK signal having a predetermined fixed delay with respect to the CLK_IN signal (wherein these signals are not necessarily synchronous).

Figure 5:
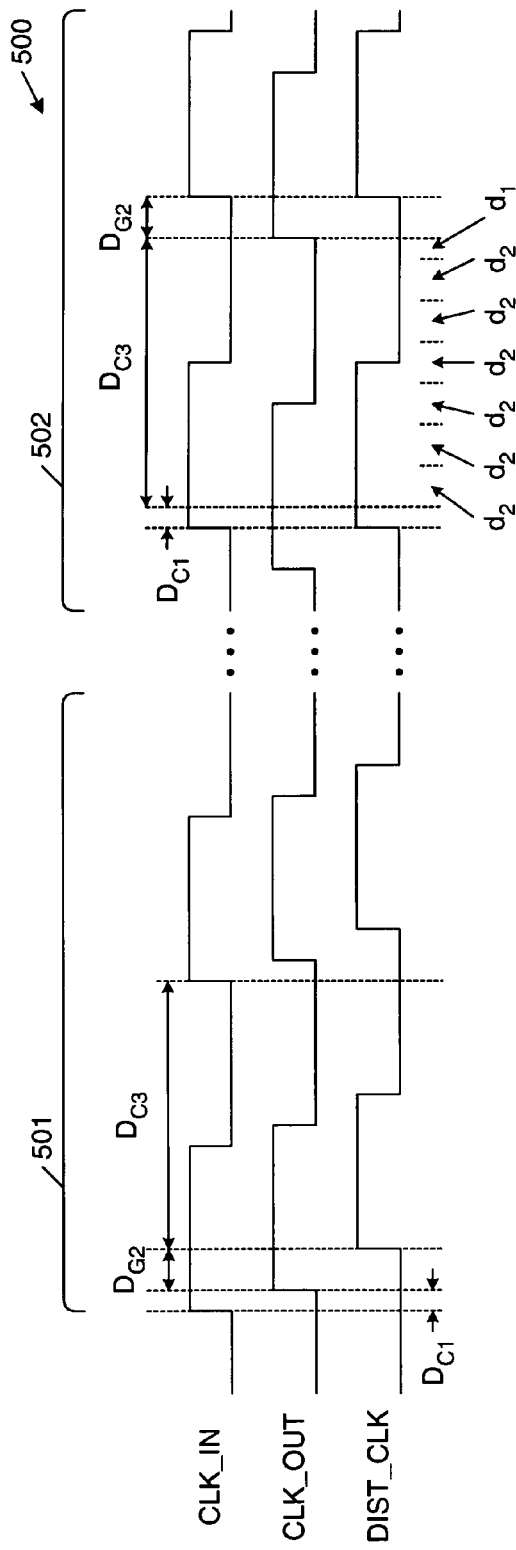
FIG. 5 is a waveform diagram illustrating the timing of various DLL clock signals during low frequency operation, in accordance with one embodiment of the present invention.

FIG. 5 is a waveform diagram 500 illustrating the timing of the clock signals CLK_IN, CLK_OUT and DIST_CLK during low frequency operation, in accordance with one embodiment of the present invention. FIGS. 4 and 5 have an identical scale in the described examples. Region 501 of waveform diagram 500 illustrates the CLK_IN, CLK_OUT and DIST_CLK signals before DLL 200 introduces any delay to the output clock signal CLK_OUT. At this time, the CLK_OUT signal exhibits a small delay $D_{C1}$ with respect to the input clock signal CLK_IN. The DIST_CLK signal exhibits a delay $D_{G2}$, which is introduced by the global clock routing network. Note that $D_{G2}$ is equal to $D_{G1}$ (FIG. 4) in the embodiment described in FIG. 2. In order for the rising edge of the distributed clock signal DIST_CLK to be synchronous with the rising edge of the input clock signal CLK_IN, a delay of $D_{C3}$ must be introduced to the distributed clock signal DIST_CLK. Note that $D_{C3}$ is much greater than $D_{C2}$ (FIG. 4), due to the lower frequency of the input clock signal CLK_IN in FIG. 5.

Region 502 of waveform diagram 500 illustrates the CLK_IN, CLK_OUT and DIST_CLK signals after DLL 200 has introduced a delay of $D_{C3}$ to the output clock signal CLK_OUT. Again, DLL 200 sequentially introduces delay elements to the delay line until the desired delay is achieved. At this time, the CLK_IN and DIST_CLK signals are synchronous. In the illustrated example, the delay $D_{C3}$ is equal to $6*d_2+d_1$. Thus, DLL 200 introduces the delay $D_{C3}$ by generating a multiplexer control signal M1 that causes the clock signal ($C_6$) of the sixth delay element ($205_6$) in delay chain 202 to be routed as the $C_{OUT}$ signal, and generating a multiplexer control signal M2 that causes the clock signal $C_{OUTD}$ to be routed as the output clock signal CLK_OUT. Note that the delay $d_1$ of fast delay element 206 is used to fine-tune the delay $D_{C3}$ in the example of FIG. 5.

In accordance with one variation of the present invention, bias voltages applied to the well regions of the transistors used in inverters $301_1$–$301_M$ can be controlled to control the delay of delay element $205_1$ (See, FIG. 3). Similar control is also exercised over delay elements $205_2$–$205_N$. For example, if p-channel FET 310 is fabricated in an n-well region, and n-channel FET 320 is fabricated in a p-well region, then a higher bias voltage applied to the n-well region and a lower bias voltage applied to the p-well region will result in a relatively small signal delay through the associated inverter $301_1$. Conversely, a lower bias voltage applied to the n-well region and a higher bias voltage applied to the p-well region will result in a relatively large signal delay through the associated inverter $301_1$. Thus, during high frequency operation, a high bias voltage is applied to the n-well region and a low bias voltage is applied to the p-well region. During low frequency operation, a low bias voltage is applied to the n-well region and a high bias voltage is applied to the p-well region.

In yet another embodiment, both the well bias voltages and the voltage of voltage supply line 222 are controlled in order to control the delay of delay line 202. In further embodiments, other techniques known to those of skill in the art may be used to provide a selectable voltage for voltage supply line 222. For example, the voltage may be supplied from an external source, or by a voltage regulator allowing for selection of one of at least two possible output voltages.

In some embodiments, a voltage supply line similar to voltage supply line 222 may be connected to the ground terminals of the delay elements, where adjusting the voltage of that voltage supply line adjusts the delay. In yet other embodiments, other known techniques for adjusting delay of a circuit may be used to adjust delay of the delay elements of delay line 202 in accordance with the present invention. In such embodiments, a delay control circuit, based on a value stored in one or more configuration memory cells, may be used to adjust the delays of the delay elements in accordance with the present invention and such known techniques. The value stored in the configuration memory cell may depend on the mode of operation (e.g., high or low frequency operation).

Although the invention has been described in connection with several embodiments, it is understood that this invention is not limited to the embodiments disclosed, but is capable of various modifications, which would be apparent to one of ordinary skill in the art. For example, while the present invention has been described using two supply voltages $V_{S1}$ and $V_{S2}$, which provide two delay values $d_1$ and $d_2$, it is understood that the present invention can be extended to more than two supply voltages, which provide more than two delay values. Thus, the invention is limited only by the following claims.

We claim:

1. A delay locked loop comprising:
    a primary delay line comprising a plurality of series-connected delay elements, wherein each of the delay elements has an adjustable delay;
    a delay control circuit coupled to the primary delay line;
    at least one configuration memory cell coupled to the delay control circuit;
    wherein the delay control circuit adjusts delay of the delay elements of the primary delay line in response to the at least one configuration memory cell;
    a voltage distribution line, wherein each of the delay elements operates in response to a voltage on the voltage distribution line;
    a first voltage terminal for receiving a first voltage;
    a second voltage terminal for receiving a second voltage, wherein the first voltage is greater than the second voltage;
    wherein the delay control circuit selectively couples the first voltage terminal or the second voltage terminal to the voltage distribution line responsive to the at least one configuration memory cell;
    a clock input terminal for receiving an input clock signal, wherein the clock input terminal is coupled to an input terminal of the primary delay line;
    a first multiplexer coupled to receive delayed versions of the input clock signal from the delay elements of the primary delay line; and
    a delay selection circuit coupled to control the first multiplexer in response to the input clock signal and a distributed version of the input clock signal;
    wherein the first voltage terminal is coupled to the voltage distribution line for operating the delay locked loop in a high frequency mode when the at least one configuration memory cell stores a first data value; and
    wherein the second voltage terminal is coupled to the voltage distribution line for operating the delay locked loop in a low frequency mode when the at least one configuration memory cell stores a second data value.

2. The delay locked loop of claim 1, wherein each of the delay elements exhibits a first delay when the voltage distribution line is coupled to receive the first voltage, and a second delay when the voltage distribution line is coupled to receive the second voltage, wherein the second delay is greater than the first delay.

3. The delay locked loop of claim 2, wherein the second delay is substantially twice as long as the first delay.

4. The delay locked loop of claim 1, wherein the first voltage is 10 or more percent greater than the second voltage.

5. The delay locked loop of claim 1, wherein each of the delay elements comprises a plurality of series-connected inverters.

6. The delay locked loop of claim 5, wherein each of the inverters comprises a p-channel transistor having a source coupled to the voltage distribution line.

7. The delay locked loop of claim 5, wherein each of the inverters comprises a transistor having a well region coupled to the voltage distribution line.

8. The delay locked loop of claim 1, further comprising a voltage regulator for providing at least one of the first and second voltages.

9. The delay locked loop of claim 1, further comprising:
    a second multiplexer having a first input terminal coupled to receive a delayed version of the input clock signal routed by the first multiplexer; and
    a fast delay element having an input terminal coupled to receive the delayed version of the input clock signal routed by the first multiplexer, and an output terminal coupled to a second input terminal of the second multiplexer.

10. The delay locked loop of claim 9, wherein the fast delay element selectively provides one of a plurality of delays.

11. The delay locked loop of claim 9, further comprising a clock distribution network coupled to an output terminal of the second multiplexer, wherein the distributed version of the input clock signal is provided at an end of the clock distribution network.

12. The delay locked loop of claim 9, wherein the delay selection circuit is coupled to control the second multiplexer.

13. A field programmable gate array (FPGA) comprising:
    an input clock terminal for receiving an input clock signal used to clock data into the FPGA;
    a global clock routing network that provides a distributed clock signal in response to the input clock signal, wherein the distributed clock signal is used to clock data into or out of the FPGA;
    a delay locked loop that forces the distributed clock signal into a fixed phase relationship with the input clock signal by introducing signal delay to the input clock signal, wherein the delay locked loop includes:
        a primary delay line comprising a plurality of series-connected delay elements, wherein each of the delay elements operates in response to a voltage on a voltage distribution line;
        a first voltage terminal for receiving a first voltage;
        a second voltage terminal for receiving a second voltage, wherein the first voltage is greater than the second voltage;
        at least one configuration memory cell; and
        a voltage selection circuit coupled to the at least one configuration memory cell, the voltage selection circuit being responsive to the at least one configuration memory cell for selectively coupling the first voltage terminal or the second voltage terminal to the voltage distribution line;
        wherein if the at least one configuration memory cell is in a first state, the voltage selection circuit couples the first voltage terminal to the voltage distribution line for operating the delay locked loop in a high frequency operation mode, and wherein if the at least one configuration memory cell is in a second state, the voltage selection circuit couples the second voltage terminal to the voltage distribution line for operating the delay locked loop in a low frequency operation mode.

14. The FPGA of claim 13, wherein each of the delay elements comprises a plurality of series-connected inverters.

15. The delay locked loop of claim 14, wherein each of the inverters comprises a p-channel transistor having a source coupled to the voltage distribution line.

16. The delay locked loop of claim 14, wherein each of the inverters comprises a transistor having a well region coupled to the voltage distribution line.

17. A method of operating a delay locked loop comprising:

applying an input clock signal to a delay line including a plurality of series-connected delay elements, each of the delay elements having a voltage-controlled delay;

operating the delay elements in response to a first voltage when the input clock signal has a frequency greater than or equal to a first frequency; and operating the delay elements in response to a second voltage when the input clock signal has a frequency less than the first frequency.

18. The method of claim 17, further comprising:
programming a configuration memory cell to store a data value;

operating the delay elements in response to the first voltage when the data value has a first state; and operating the delay elements in response to the second voltage when the data value has a second state.

19. The method of claim 17, wherein the first voltage is greater than the second voltage.

20. The method of claim 19, wherein the first voltage is at least 10 percent greater than the second voltage.

21. The method of claim 17, further comprising:

routing a delayed version of the input clock signal from a delay element of the primary delay line to a global clock routing network, whereby a distributed clock signal is provided at an end of the global clock routing network;

comparing the distributed clock signal with the input clock signal; and selecting the delayed version of the input clock signal in response to the step of comparing the distributed clock signal with the input clock signal.

22. The method of claim 21, the routing step further comprising:

routing a first delayed version of the input clock signal from a delay element of the primary delay line to a fast delay element, wherein the fast delay element provides a second delayed version of the input clock signal; and selectively routing either the first delayed version of the input clock signal or the second delayed version of the input clock signal to the global clock routing network, whereby the distributed clock signal is provided at an end of the global clock routing network.

23. The method of claim 22, further comprising:

comparing the distributed clock signal with the input clock signal; and selecting the first delayed version of the input clock signal or the second delayed version of the input clock signal in response to the step of comparing the distributed clock signal with the input clock signal.

* * * * *